(12) United States Patent
Fujita

(10) Patent No.: US 6,271,572 B1
(45) Date of Patent: Aug. 7, 2001

(54) MULTI-VOLTAGE LEVEL SEMICONDUCTOR DEVICE AND ITS MANUFACTURE

(75) Inventor: Harumitsu Fujita, Hamamatsu (JP)

(73) Assignee: Yamaha Corporation (JP)

( * ) Notice: Subject to any disclaimer, the term of this patent is extended or adjusted under 35 U.S.C. 154(b) by 0 days.

(21) Appl. No.: 09/021,519

(22) Filed: Feb. 10, 1998

(30) Foreign Application Priority Data

Feb. 12, 1997 (JP) .................................................... 9-028132

(51) Int. Cl.[7] ........................... H01L 29/76; H01L 29/94; H01L 31/062; H01L 31/113
(52) U.S. Cl. ........................... 257/392; 257/402; 257/392
(58) Field of Search .................................... 438/217, 231, 438/275, 301; 257/214, 409, 339, 366, 400, 402, 406, 408, 399, 392, 369, 372

(56) References Cited

U.S. PATENT DOCUMENTS

| | | | |
|---|---|---|---|
| 4,978,628 | * 12/1990 | Rosenthal | 438/220 |
| 5,254,487 | * 10/1993 | Tamagawa | 438/217 |
| 5,314,834 | 5/1994 | Mazure et al. | 438/301 |
| 5,472,887 | * 12/1995 | Hutter et al. | 438/231 |
| 5,480,828 | * 1/1996 | Hsu et al. | 438/275 |
| 5,595,922 | * 1/1997 | Tigelaar et al. | 438/231 |
| 5,679,968 | 10/1997 | Smayling et al. | 257/213 |
| 5,681,768 | 10/1997 | Smayling et al. | 438/301 |
| 5,858,827 | * 1/1999 | Ono | 438/232 |
| 6,093,950 | * 7/2000 | Kuroda | 257/369 |

FOREIGN PATENT DOCUMENTS 2-58261  2/1990  (JP) .

\* cited by examiner

Primary Examiner—Long Pham
Assistant Examiner—William David Coleman
(74) Attorney, Agent, or Firm—Ostrolenk, Faber, Gerb & Soffen, LLP

(57) ABSTRACT

In a semiconductor device comprising a MOS transistor driven at a relatively low voltage and a MOS transistor driven at a relatively high voltage formed on the same semiconductor substrate, the MOS transistor driven at the relatively high voltage comprises: a first active region of a first conductivity type in the semiconductor substrate; a first gate oxide film formed on the first active region and having increased thickness at the edge regions thereof than in the central region thereof in the direction of current flow; and a first electrode formed on the first gate oxide film and doped at a relatively low concentration with an impurity of a second conductivity type which is opposite to the first conductivity type; and the MOS transistor driven at the relatively low voltage comprises: a second active region of a first conductivity type in the semiconductor substrate; a second gate oxide film formed on the second active region; and a second electrode formed on the second gate oxide film and doped at a relatively high concentration with an impurity of a second conductivity type. A multi-voltage level semiconductor device is provided whereby increases in the number of manufacturing steps can be restricted and decline in the performance of MOS transistors for use in low-voltage circuits can be suppressed.

15 Claims, 6 Drawing Sheets

MULTI-VOLTAGE LEVEL SEMICONDUCTOR DEVICE AND ITS MANUFACTURE

This application is based on a Japanese patent application No. 9-28132 filed on Feb. 12, 1997, the whole contents of which are incorporated herein by reference.

BACKGROUND OF THE INVENTION a) Field of the Invention

The present invention relates to a semiconductor device and a method of manufacturing same, and more particularly, to a semiconductor device handling a plurality of voltage levels, and a method of manufacturing same.

b) Description of the Related Art

Drive voltages for semiconductor integrated circuits have tended to fall as savings in power consumption are made. For example, analogue circuits, such as a TTL, have been developed with a 5 V power source, but subsequently developed digital circuits are generally driven at 3.3 V. The drive power supply for digital circuits has been tending to fall even further, to 2.5 V. In memory devices, and the like, even more significant voltage reductions have been achieved. The signal level depends on the power supply voltage, such that, for example, the level is "1" when the voltage is 70% or above of the power supply voltage and it is "0" when the voltage is 30% or less.

Integrated circuit devices containing several types of functional circuit are sometimes required to handle a plurality of voltage levels. For the sake of convenience, such devices are known as multi-voltage level devices. These contain a high-voltage circuit driven by a relatively high-voltage power supply and a low-voltage circuit driven by a relatively low-voltage power supply.

In a metal-oxide-semiconductor (MOS) transistor, the source electrode is usually grounded and the power supply voltage is supplied to the drain electrode. The gate electrode can be supplied optionally with a ground potential or the power supply voltage. The gate oxide film must have a breakdown voltage corresponding to the power supply voltage in the vicinity of the source electrode and the drain electrode. In a multi-voltage level device, the low-voltage circuit and the high-voltage circuit have different voltage levels supplied to the gate electrode.

In certain types of multi-voltage level device, the gate oxide film differs in thickness in low-voltage circuit MOS transistors and high-voltage circuit MOS transistors. Low-voltage circuit MOS transistors have a thin gate oxide film and high-voltage circuit MOS transistors have a thick gate oxide film. By varying the thickness of the gate oxide film in this way depending on the power supply voltage, it is possible to use high-performance MOS transistors for both low-voltage circuits and high-voltage circuits. However, since the gate oxide films vary in thickness, it is necessary to provide separate gate oxide film forming processes. This increases the number of manufacturing steps, and hence causes manufacturing costs to increase.

If low-voltage circuits and high-voltage circuits are fabricated using gate oxide films of uniform thickness, then MOS transistors in low-voltage circuits will have the same thickness as MOS transistors in high-voltage circuits. A suitable thickness for high-voltage circuit gate oxide films will be unnecessarily thick for low-voltage circuits, and hence MOS transistor performance will decline.

As described above, if a low-voltage circuit and high-voltage circuit are fabricated in a multi-voltage level device using the same manufacturing process, the performance of the low-voltage circuit MOS transistors will decline.

SUMMARY OF THE INVENTION

An object of the present invention is to provide a multi-voltage level device whereby increases in the number of manufacturing steps can be restricted and any decline in the performance of low-voltage circuit MOS transistors can be suppressed.

A further object of the present invention is to provide a method of manufacturing a semiconductor device comprising insulated gate electrodes having increased voltage tolerance in high-voltage circuit MOS transistors, which are fabricated by the same manufacturing process.

According to one aspect of this invention, there is provided a semiconductor device comprising a first MOS transistor driven at a first voltage and a second MOS transistor driven at a second voltage higher than the first voltage both formed on a same semiconductor substrate, wherein: the second MOS transistor driven at said relatively high voltage comprises: a first active region of a first conductivity type in said semiconductor substrate; a first gate oxide film formed on said first active region; and a first electrode formed on said first gate oxide film and doped at a first concentration with an impurity of a second conductivity type which is opposite to the first conductivity type; and the first MOS transistor driven at said relatively low voltage comprises: a second active region of a first conductivity type in said semiconductor substrate; a second gate oxide film formed on said second active region; and a second electrode formed on said second gate oxide film and doped at a second concentration higher than the first concentration with an impurity of the second conductivity type.

According to another aspect of the present invention, there is provided a method of manufacturing a semiconductor device comprising a plurality of MOS transistors comprising the steps of: preparing a semiconductor substrate having a plurality of active regions of a first conductivity type; forming first gate oxide films onto said plurality of active regions; forming an electrode layer onto said first gate oxide films; patterning said electrode layer to form gate electrode patterns onto each of said plurality of active regions; oxidizing the surface of said gate electrode patterns to form second gate oxide films which is integrated with said first gate oxide films, and gradually decrease in thickness from side walls of the gate electrode pattern towards a centre portion thereof; first doping said plurality of active regions at first concentration with an impurity of a second conductivity type which is opposite to said first conductivity type using said gate electrode pattern as a mask, to dope said gate electrode patterns and the active regions on either side thereof at low concentration; and second doping, while covering a portion of said plurality of active regions by a mask, remainder of the active regions at second concentration higher than the first concentration with an impurity of a second conductivity type, to dope the gate electrode patterns and the active regions on either side thereof at the second concentration in said remainder of the active regions.

It is possible to create a depletion layer in the gate electrode in high-voltage circuit MOS transistors on the channel side by reducing the doping of the impurity in the gate electrodes. By creating a depletion layer, the electric field applied to the gate oxide film in high-voltage circuit is decreased and hence the breakdown voltage is increased. Furthermore, by forming the gate oxide film more thickly at the edges thereof than in the central portion thereof, it is possible to increase the breakdown voltage in the edge regions of gate electrodes, where the electric field is concentrated.

In this way, it is possible to fabricate MOS transistors having different characteristics in a high-voltage circuit and a low-voltage circuit, without increasing the number of manufacturing steps.

It is also possible to fabricate MOS transistors having different breakdown voltages for gate insulating films, without varying the thickness of the gate oxide films. Therefore, it is possible to provide a multi-voltage level semiconductor device having superior characteristics.

DESCRIPTION OF THE PREFERRED EMBODIMENTS

FIGS. 1A–1D are schematic sectional views of MOS transistors in a multi-voltage level semiconductor device according to an embodiment of the present invention.

Figure 1A:
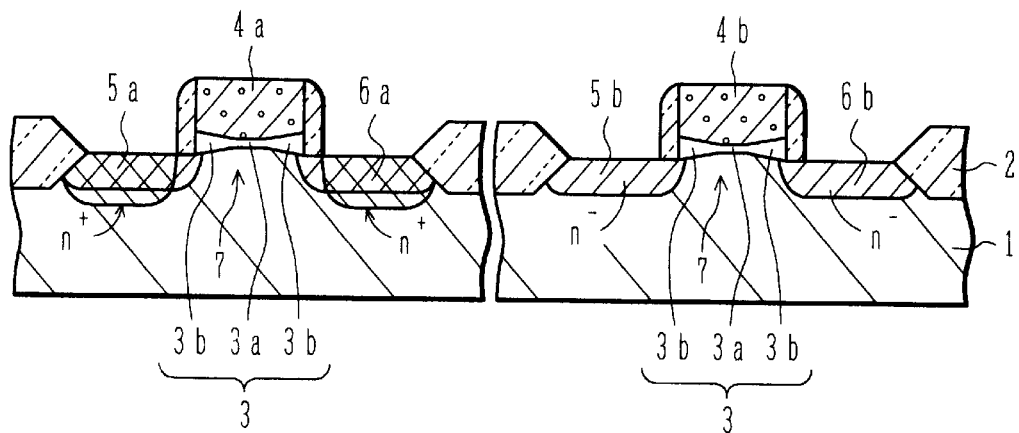
FIGS. 1A–1D are schematic sectional views for illustrating MOS transistors in a multi-voltage level semiconductor device according to an embodiment of the present invention.

In FIG. 1A, a MOS transistor for a low-voltage circuit is shown on the left-hand side, and a MOS for a high-voltage circuit is shown on the right-hand side. For example, a field oxide film 2 is formed onto the surface of a silicon substrate 1, to define or demarcate active regions. Gate oxide films 3 are then formed onto the surface of the active regions. Here the thickness of the gate oxide film 3 gradually decreases from the edges 3b towards the centre 3a of the film, with respect to the direction in which current flows through the MOS transistor.

Polycrystalline silicon electrodes 4a, and 4b are formed onto the gate oxide films 3. The polycrystalline silicon electrode 4a for a low-voltage circuit is doped with a higher concentration of impurity than the polycrystalline silicon electrode 4b for the high-voltage circuit. For example, the impurity concentration in polycrystalline silicon electrode 4a is of the order of $10^{20}$ cm$^{-3}$, whereas the impurity concentration in polycrystalline silicon electrode 4b is approximately $1 \times 10^{18}$ cm$^{-3}$–$5 \times 10^{19}$ cm$^{-3}$.

Side wall spacers made from silicon oxide are formed at the edge regions of the gate electrodes 4a, and 4b. Regions (LDDs) doped shallowly at a low concentration with an impurity of the same conductivity type as the gate electrode are formed below the side wall spacers of gate 4a of the low-voltage circuit MOS transistor, and source and drain regions 5a, and 6a (n$^+$) doped deeply at a high concentration with the impurity are formed on the opposite sides of the LDDs to the gate electrode. On the other hand, in the high-voltage circuit MOS transistor, source and drain regions 5b, 6b doped shallowly at low concentration with impurity of the same conductivity type as the gate electrode are formed below the gate side wall spacers and adjacently thereto, on opposite sides to the gate electrode. The impurity concentration in the source and drain regions 5b, and 6b is similar to the impurity concentration in the gate electrode of the high-voltage circuit MOS transistor, namely, approximately $10^{18}$ cm$^{-3}$–$5 \times 10^{19}$ cm$^{-3}$. Hereinbelow, either one or both of the source regions 5a, and 5b may be referred to as "source region 5". Similarly, either one or both of the drain regions 6a, 6b may be referred to as "drain region 6". Furthermore, the collective term "source/drain" may also be used to refer to both sources and drains.

The gate oxide films 3 in low-voltage circuit MOS transistors and high-voltage circuit MOS transistors have equal thickness in the central regions thereof. Channel regions 7 are defined or demarcated below the gate electrodes 4 between the source/drain regions 5, 6.

Figure 1B:
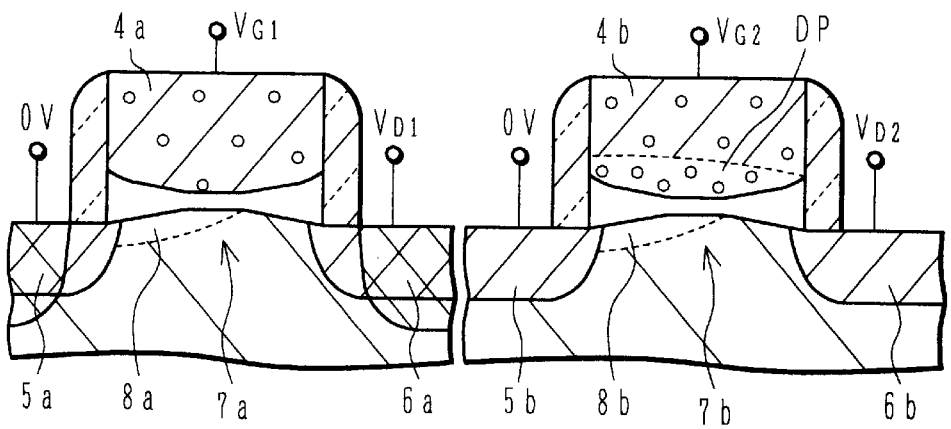

FIG. 1B shows the state of the transistors when voltages are applied to the gate electrode and source/drain regions. The source region 5 is connected to earth potential (0V), and the drain region 6 is connected to the power supply voltage ($V_{D1}$, $V_{D2}$). A gate voltage $V_{G1}$, $V_{G2}$ which varies depending on whether the transistor is in an on state or an off state, is supplied to the gate electrode 4. Here, in a low-voltage circuit, voltages $V_{G1}$ and $V_{D1}$ in the on state are the low-voltage level power supply voltage, and in a high-voltage circuit, voltages $V_{G2}$ and $V_{D2}$ in the on state are the high-voltage circuit power supply voltage.

In the MOS transistor for use in low-voltage circuits, as shown on the left-hand side, when power supply voltage $V_{G1}$ is applied to the gate electrode 4a, an inversion layer 8a is induced in the channel 7a. The voltage between the source region 5a and inversion layer 8a, and the gate electrode 4a is received by the gate oxide film 3a. The gate oxide film 3a is selected such that it matches the low-voltage circuit power supply voltage.

In the high-voltage circuit MOS transistor, when the power supply voltage $V_{G2}$ is applied to the gate electrode 4b, an inversion layer 8b is induced in the channel region 7b, and a depletion layer DP is created on the channel side of the gate electrode 4b, which is doped at a low impurity concentration. Since the depletion layer DP functions effectively as an insulating layer, the electric field applied to the gate insulating film below the gate electrode 4b is reduced.

On the other hand, in the off state of the high-voltage transistor, the gate electrode is not depleted because the source region 5b and the gate electrode 4b are connected to earth potential. Also in this case a high voltage is applied to the gate oxide when the drain region 6b is connected to the power supply voltage. Since the gate oxide film 3 is formed more thickly at its edges than in its central region, the electric field applied to the edge region of the gate oxide film is reduced.

By forming the gate oxide film 3 more thickly at its edges than in its central region and generating a depletion layer DP within the gate electrode 4b, the breakdown voltage of the insulated gate structure in a high-voltage circuit MOS transistor can be raised, even if the gate oxide film 3 itself has the same thickness as the gate oxide film 3 in a low-voltage circuit component.

Figure 1C:
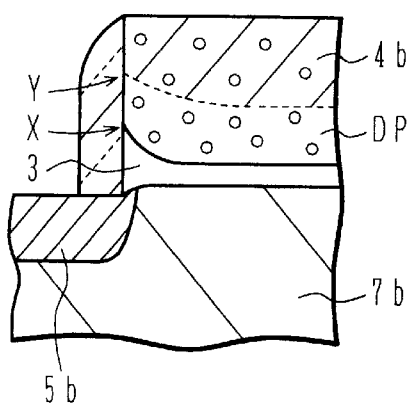

FIG. 1C shows an enlarged portion of a source region 5b and a gate electrode 4b in a high-voltage circuit MOS transistor. If the gate electrode 4b is at the same potential as the source region 5b, then the whole gate electrode 4b, which is made of silicon, will function as a gate electrode.

When a power supply voltage is applied to the gate electrode 4b, an inverse bias acts between the source region 5b, channel region 7b and gate electrode 4b, thereby creating a depletion layer DP. The gate electrode 4b effectively develops a boundary, as marked by the dotted line, and the effective position of the gate electrode 4b in the lowermost portion thereof moves from X to Y. In this way, when a high voltage is applied to the gate electrode of a high-voltage circuit MOS transistor, the electric field applied to the gate oxide film is reduced by the depletion layer created in the gate electrode, and therefore breakdown voltage is improved.

Moreover, since the gate oxide film is formed more thickly at its edges than in its central region, the thickness of the gate insulating film in the edge regions of the gate electrode, where a high electric field is applied, is increased. Furthermore, concentration of the electric field is eased by the fact that the electric field between the gate oxide film 3 and the gate electrode 4b forms a smooth convex curve toward the source region 5b.

Figure 1D:
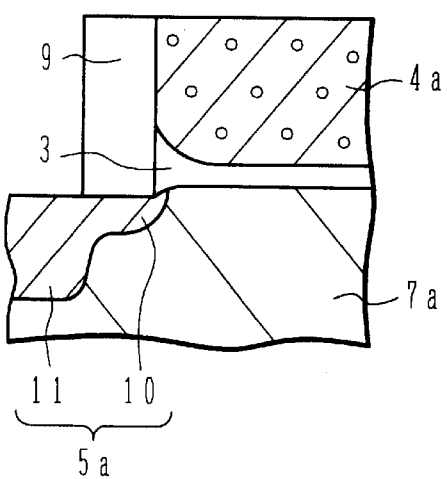

FIG. 1D shows an enlarged sectional view of a portion of a source region 5a and gate electrode 4a in a low-voltage MOS transistor. An insulating side wall spacer 9 is formed on the side wall of the gate electrode 4a. The source region 5a is constituted by an extended section (LDD region) 10 of low impurity concentration, which partially overlaps with the gate electrode 4a in the plane of the substrate, and a source region 11 of high impurity concentration, which is aligned in position with the edge of the insulating spacer 9. The high-impurity-concentration source region 11 lowers the effective resistance of the source region as a whole.

Since the gate electrode 4a is doped with impurity at a high concentration, no depletion layer is created. By selecting an optimum thickness of the gate oxide film 3 for the low-voltage MOS transistor, a high-performance low-voltage MOS transistor can be formed.

In both of the transistors described above, a gate oxide film which is thicker at its edges in the vicinity of the source/drain regions than in its central portion can be formed by gate electrode patterning followed by thermal oxidation.

Figure 2:
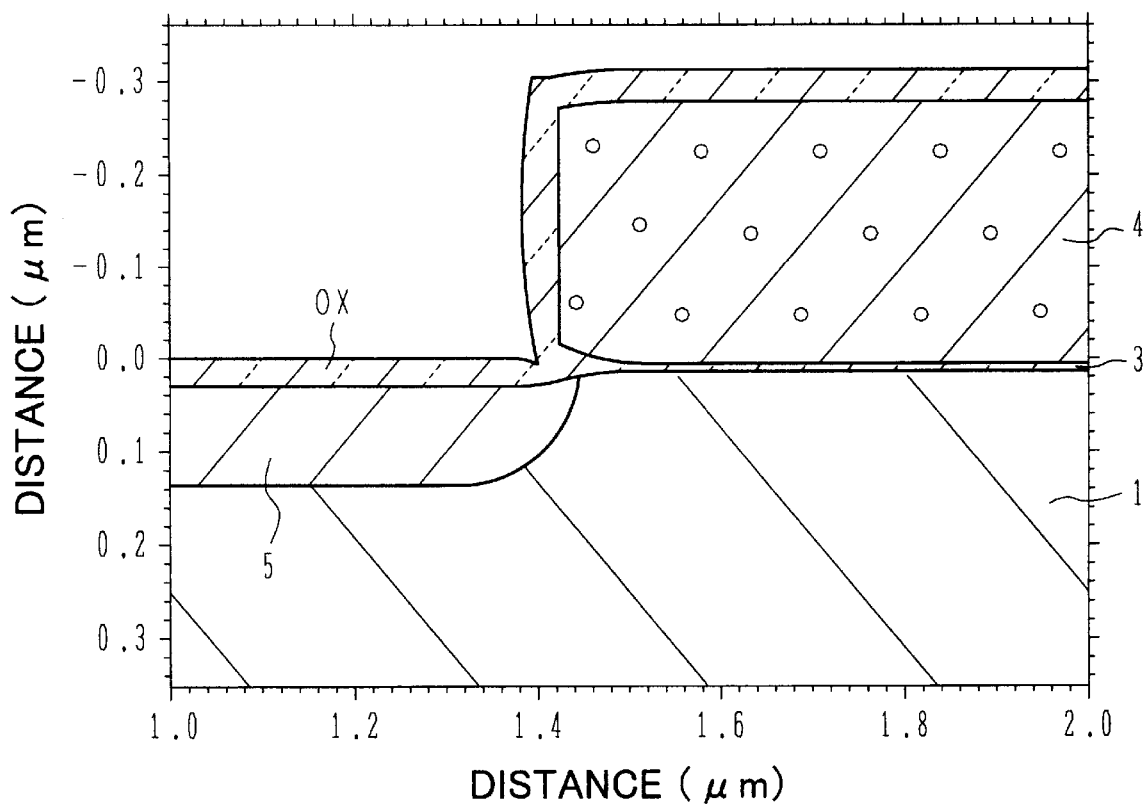
FIG. 2 is a sectional view illustrating the shape of an oxide film formed by oxidation after gate electrode patterning.

FIG. 2 shows simulation results for the form of an oxide film formed on the surface of a gate electrode, by gate electrode patterning followed by thermal oxidation. A gate oxide film 3 approximately 9 nm thick is formed on the surface of a silicon substrate 1, and a polycrystalline silicon gate electrode 4 approximately 300 nm thick is then formed onto this. After patterning the polycrystalline silicon gate electrode 4 by lithography and etching, thermal oxidation was carried out for 60 minutes at 950° C. in an $O_2$ atmosphere, and an oxide film OX approximately 30 nm thick was grown onto the surface of the silicon substrate 1.

In this process, the oxide film OX penetrates below the edge regions of the gate electrode, thereby the shape of the edge regions of the gate electrode 4 is smoothed or rounded, and furthermore, the thickness of the gate oxide film 3 is increased in these regions. By subsequently performing ion implantation using the gate electrode 4 and the oxide film formed on the surface thereof as a mask, a source/drain region 5 is formed which overlaps partially with the gate electrode 4. The distance from the surface of the oxide film on the side wall of the gate electrode 4 to the end of the source/drain region 5 is 50 nm, and the distance from the side wall of the gate electrode 4 to the end of the source/drain region 5 is approximately 30 nm. The portion of the gate oxide film having increased thickness penetrates more deeply towards the centre of the gate electrode than the end of the source/drain region 5.

In this way, by performing thermal oxidation after patterning of polycrystalline silicon gate electrodes, it is possible to make the gate oxide film 3 thicker at its edges than in its central region, and to round the corners at the edges of the gate electrode 4. In the case shown in FIG. 2, the gate oxide film is approximately 40 nm thick at the edges of the gate electrode, which is more than four times the 9 nm thickness of the gate oxide film in the central region thereof. Desirably the thickness at the edges should be at least two times, or preferably, three times as thick, or more as that at the central region.

Figure 3A:
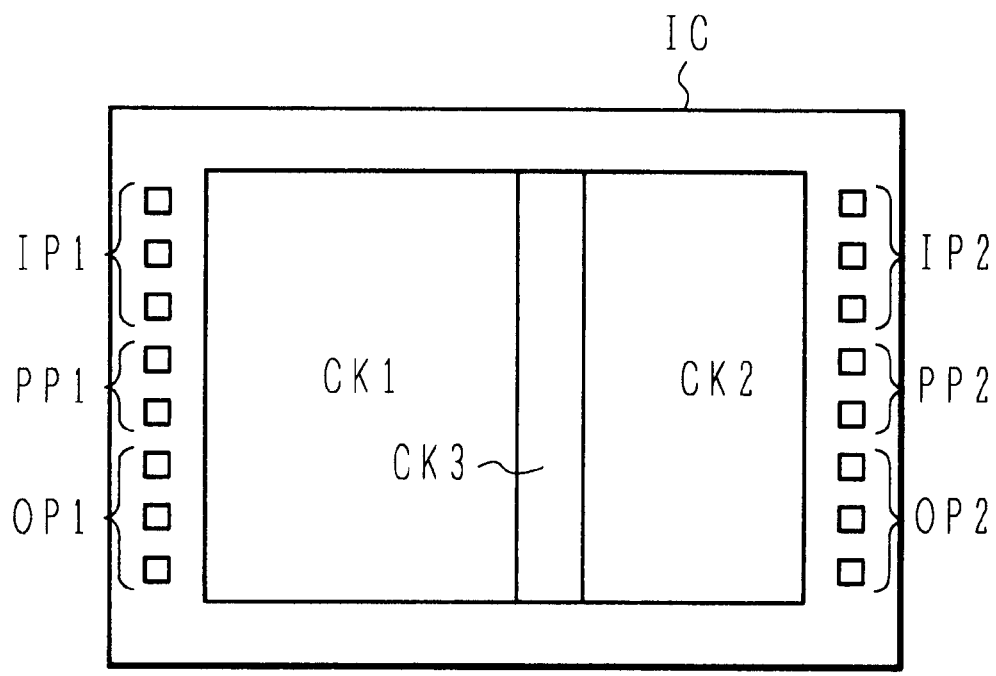
FIGS. 3A and 3B are plan views showing an approximate configuration of a multi-voltage level semiconductor device.
Figure 3B:
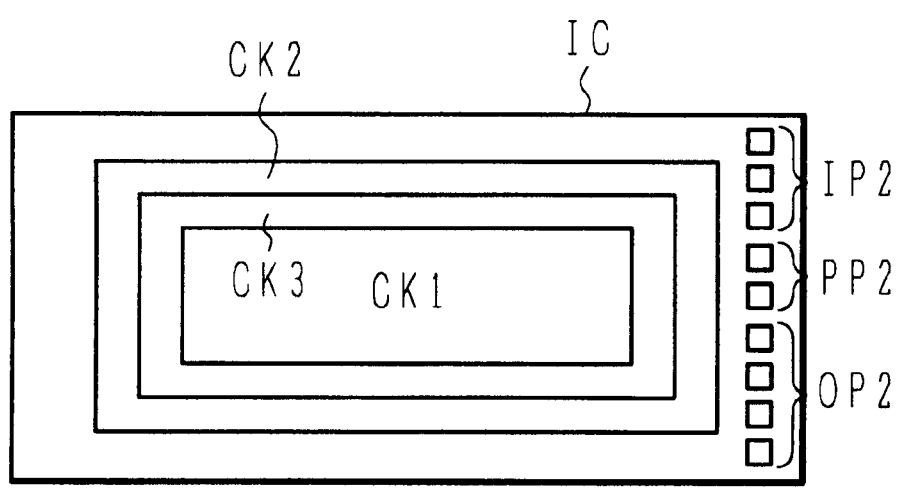

FIGS. 3A and 3B show approximate compositional examples of a multi-voltage level semiconductor device. In FIG. 3A, a low-voltage circuit CK1 and a high-voltage circuit CK2 are formed in an integrated semiconductor chip IC. The low-voltage circuit CK1 is, for example, a digital circuit, and the high-voltage circuit CK2 is an analogue circuit. A voltage level converting circuit CK3 is placed between the low-voltage circuit CK1 and the high-voltage circuit CK2.

Input pads IP1, IP2, power supply pads PP1, PP2, and output pads OP1, OP2 are positioned at the edges of the IC. The pads IP1, PP1, OP1 are pads for the low-voltage circuit CK1 and the pads IP2, PP2, OP2 are pads for the high-voltage circuit CK2.

FIG. 3B shows a further compositional example of a multi-voltage level semiconductor device. A high-voltage circuit CK2 is placed around a low-voltage circuit CK1 separated by a voltage level converting circuit CK3. The high-voltage circuit CK2 may be an output circuit, for example. High-voltage level pads IP2, PP2, OP2 are placed in the edge portion of the chip. Low-voltage level pads may be placed in another edge portion or in a central portion.

FIGS. 4A–4L show schematic sectional views of a semiconductor substrate for illustrating manufacturing steps for a multi-voltage level semiconductor device according to an embodiment of the present invention. The region on the left-hand side of the drawings is for low-voltage circuit use and the region on the right-hand side is for high-voltage circuit use.

Figure 4A:
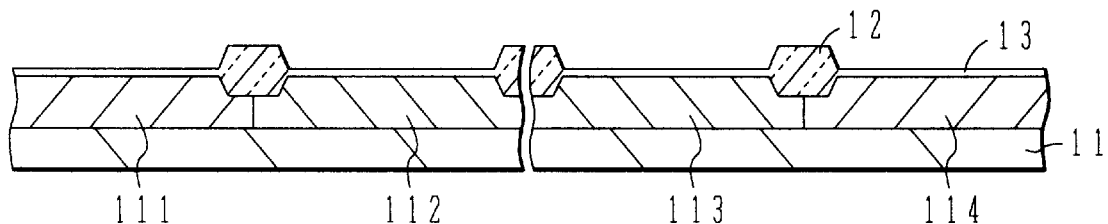
FIGS. 4A–4L are plan views schematically showing steps of a manufacturing process for a semiconductor device according to an embodiment of the present invention.

As shown in FIG. 4A, n-type wells 111, 114 and p-type wells 112, 113 are formed on the surface region of a p-type silicon substrate 11. A field oxide film 12 approximately 400 nm thick is formed onto the surface of the silicon substrate by a commonly known LOCOS (local oxidation of silicon) technique, thereby dermarcating or defining active regions. A gate oxide film 13 approximately 9 nm thick is formed onto the surface of the active regions by dry thermal oxidation, for example. This gate oxide film approximately 9 nm thick is the optimum gate oxide film for driving at low voltages.

In FIG. 4A, the n-type well 111 and p-type well 112 on the left-hand side provide a region for forming low-voltage circuit MOS transistors, and the n-type well 114 and p-type well 113 on the right-hand side provide a region for forming high-voltage circuit MOS transistors. The gate oxide film 13 having a uniform thickness is formed jointly on the n-type well 111 and p-type well 112 for the low-voltage circuit and the n-type well 114 and p-type well 113 for the high-voltage circuit by a single manufacturing step, so it is not necessary to fabricate gate oxide films of different thickness separately.

Figure 4B:
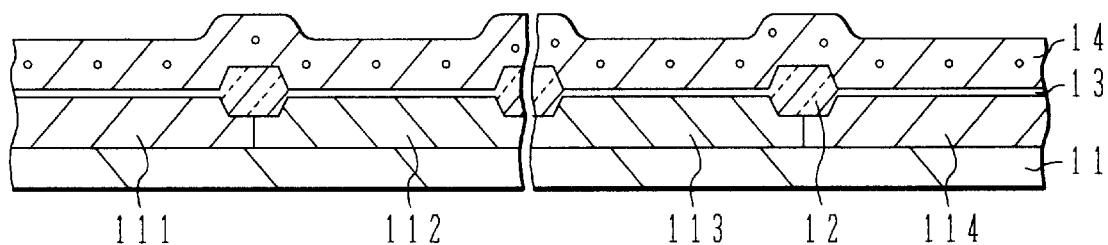

As shown in FIG. 4B, a polycrystalline silicon film 14 approximately 200 nm thick, for example, is formed by low-pressure CVD (LPCVD) onto the substrate surface on which the gate oxide film 13 was fabricated.

Figure 4C:
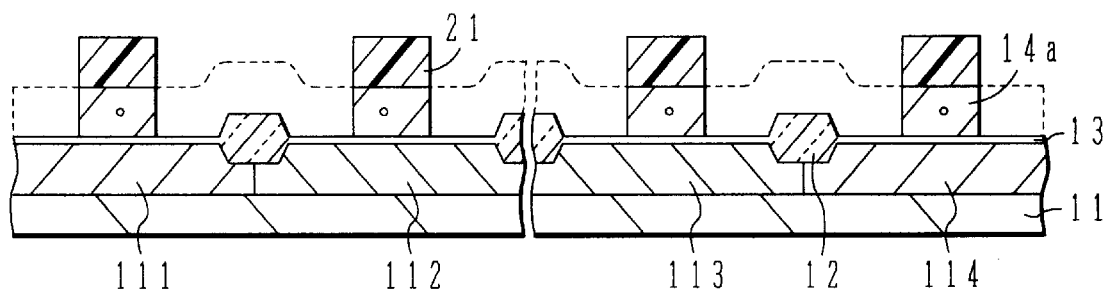

As shown in FIG. 4C, a resist pattern 21 for patterning gate electrodes is formed on the surface of the polycrystalline silicon film 14, and the polycrystalline silicon film 14 is etched using the resist pattern 21 as an etching mask. In this way, each gate electrode 14a is formed on the active region. Thereupon, the resist pattern 21 is removed.

Figure 4D:
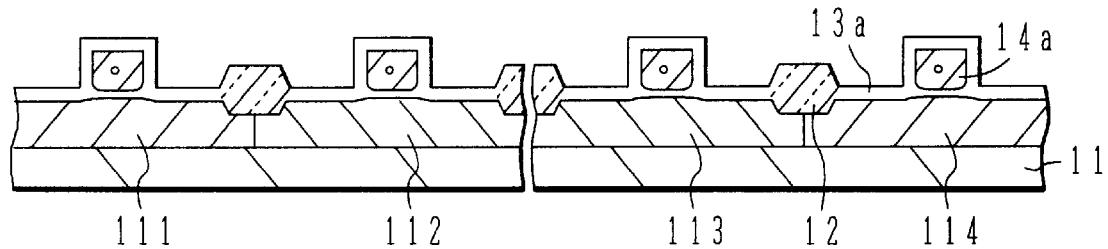

As shown in FIG. 4D, the silicon substrate 11 on which a gate electrode 14a has been formed by patterning is then subjected to dry thermal oxidation for 60 minutes at 950° C. in an $O_2$ atmosphere, thereby growing an oxide film 13a approximately 30 nm thick on the surface of the silicon substrate 11. The silicon oxide film grows more thickly on the surface of the polycrystalline silicon gate electrode 14a than on the surface of the silicon substrate.

Here, by conducting thermal oxidation of the silicon surface, the thermal oxidation will progress below the gate electrode 14a from the edges of the gate electrode towards the central region thereof, as illustrated in FIG. 2, and a silicon oxide film 13a will be formed which gradually decreases in thickness from the edge regions of the gate electrode 14a towards the central region thereof. In addition to growing the silicon oxide film, it is also possible to round or smooth the corners at the lower edges of the polycrystalline silicon gate electrode 14a. The growth of oxide film below the gate electrode in this way may be thought to be similar or analogous in some sense to the growth of "bird's beak" in LOCOS. Such resultant configurations of the oxide film under the gate electrode are common to low-voltage circuit MOS transistors and high-voltage circuit MOS transistors.

Figure 4E:
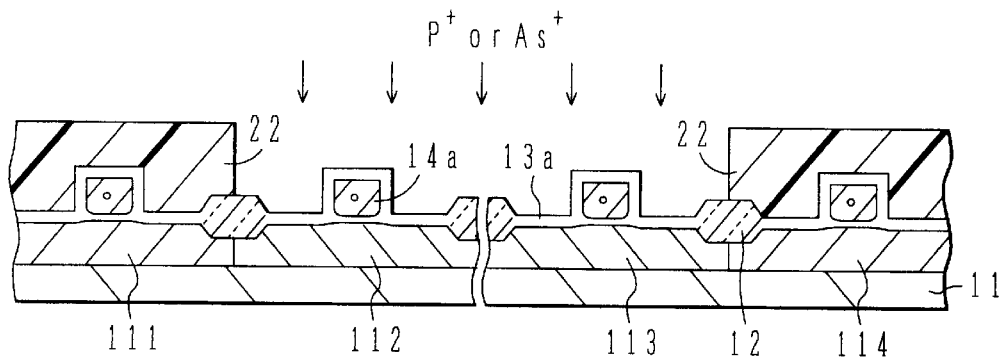

As shown in FIG. 4E, a resist pattern 22 is formed to cover the n-type wells 111, 114 and exposes the p-type wells 112, 113, and ion implantation of n-type impurity ions, such as $P^+$ ions or $As^+$ ions, is performed. For example, ion implantation of an n-type impurity is conducted to a dose of $2 \times 10^{13} - 2 \times 10^{15}$ $cm^{-2}$ at an acceleration energy of 20–80 keV.

The polycrystalline silicon gate electrode 14a formed by this ion implantation is doped with n-type impurity at approximately $1 \times 10^{16} - 5 \times 10^{19}$ $cm^{-3}$. Regions doped with n-type impurity are formed in the p-type wells 112, 113 on either side of the gate electrode 14a. The distance from the surface of silicon oxide film on the side wall of the gate electrode 14a to the edge of the region doped with n-type impurity is approximately 50 nm. In other words, the n-type impurity-doped region has an overlapping area where it extends below the gate electrode 14a. Thereupon, the resist pattern 22 is removed.

Figure 4F:
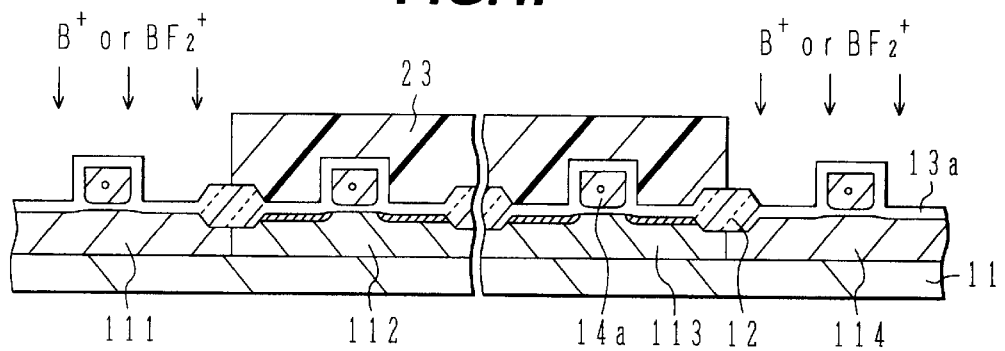

As shown in FIG. 4F, a resist pattern 23 is formed to cover the p-type wells 112, 113 and expose the n-type wells 111, 114. Using this resist pattern 23 as a mask, ion implantation of a p-type impurity, such as $B^+$ or $BF_2^+$ ions, is performed. The implantation dose of p-type impurity is similar to the n-type impurity dose of $2 \times 10^{13} - 2 \times 10^{15}$ $cm^{-2}$, as illustrated in FIG. 4E.

Figure 4G:
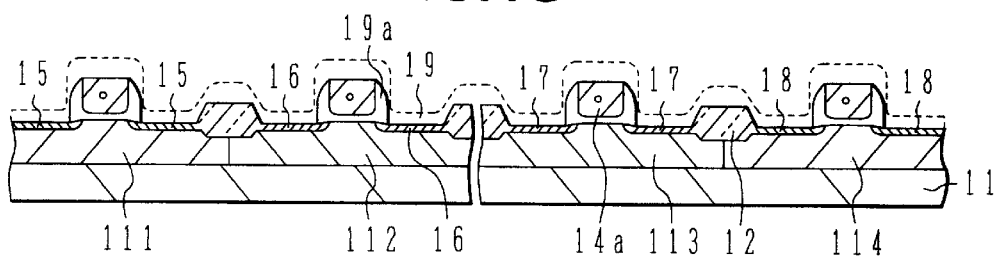

As shown in FIG. 4G, a silicon oxide film 19 approximately 200 nm thick is then deposited on the substrate surface by CVD. The silicon oxide films 19, 13a are then etched by reactive ion etching using $CHF_3/O_2/Ar$ as the etching gas, to leave side wall spacers 19a on the side walls of the gate electrode 14a, and to expose the surface of the silicon substrate.

By means of the processes described above, a p-type region 15 which is shallowly doped at low impurity concentration is formed on either side of the gate electrode of the n-type well 111, an n-type region 16 which is doped shallowly at low impurity concentration is formed on either side of the gate electrode of the p-type well 112, an n-type region 17 which is doped shallowly at low impurity concentration is formed on either side of the gate electrode of the p-type well 113, and a p-type region 18 which is doped shallowly at low impurity concentration is formed on either side of the gate electrode of the n-type well 114. These shallow low-impurity concentration (lightly doped) regions 15–18 form "LDD regions".

Figure 4H:
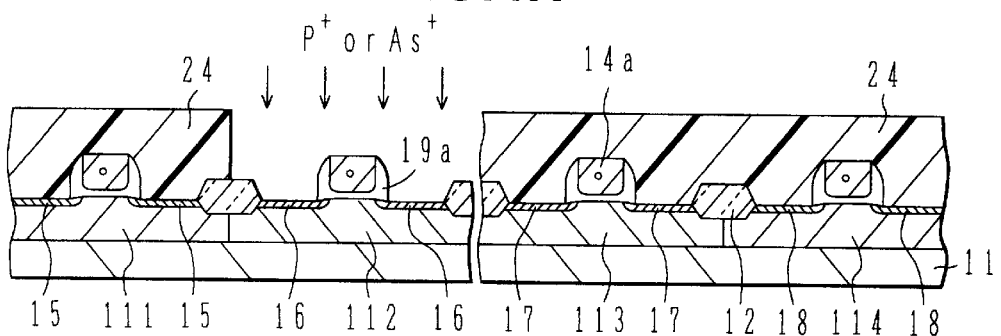

As shown in FIG. 4H, then a resist pattern 24 covering the high-voltage circuit p-type well 113 and the n-type wells 111, 114 is formed to expose the p-type well 112. Using this resist pattern as a mask, ion implantation of $P^+$ or $As^+$ n-type impurity is carried out. For example, ion implantation is carried out at a dose of $2 \times 10^{15}$ $cm^{-2}$ and acceleration energy of 40 keV, to form a high-concentration source/drain region having an n-type impurity concentration of approximately $1 \times 10^{20}$ $cm^{-3}$. The gate electrode 14a over the p-type well 112 is similarly doped at high concentration. Thereupon, the resist pattern 24 is removed.

Figure 4I:
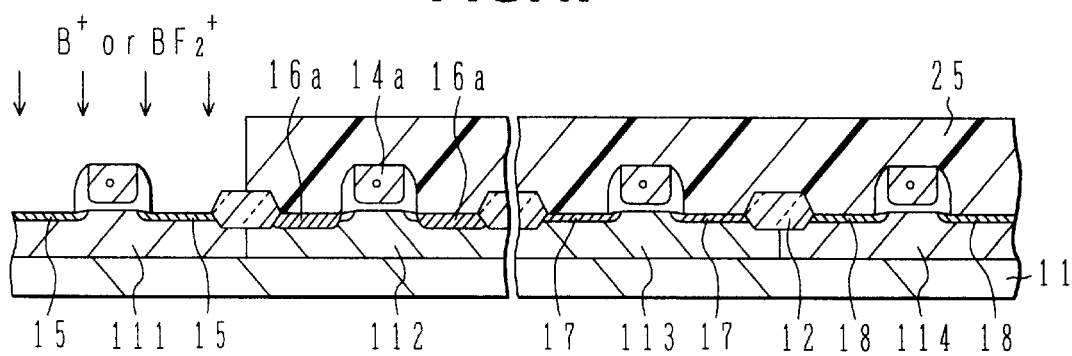

As shown in FIG. 4I, a high-impurity-concentration source/drain region 16a is formed on either side of the gate electrode 14a of the p-type well 12 by means of the ion implantation process illustrated in FIG. 4H.

Thereupon, a resist pattern 25 covering the p-type well 112, and the high-voltage circuit p-type well 113 and n-type well 114 is formed to expose the n-type well 111. Using this resist pattern 25 as a mask, the n-type well 111 is implanted with ions of $B^+$ or $BF_2^+$ p-type impurity. For example, ion implantation is conducted at a dose of $2 \times 10^{15}$ $cm^{-2}$, thereby forming source/drain regions having a p-type impurity concentration of approximately $1 \times 10^{20}$ $cm^{-3}$. The gate electrode 14a on the n-type well 111 is also doped similarly at high concentration.

Since the whole of the high-voltage circuit region is covered with resist when this high concentration of impurity is implanted, the source/drain regions 17, 18 and the gate electrodes are kept at low concentration.

Figure 4J:
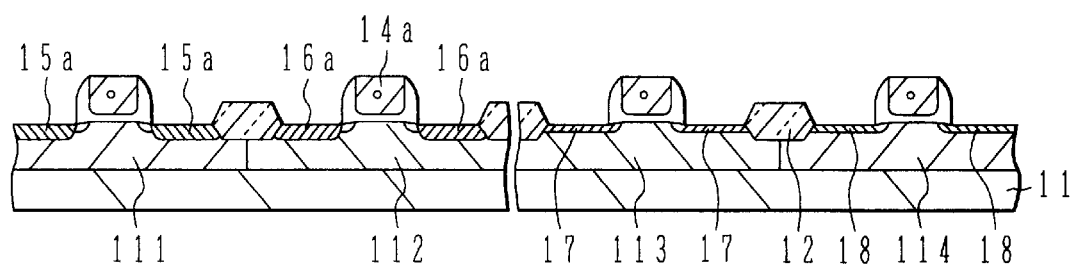

FIG. 4J shows a high-impurity-concentration source/drain region 15a formed in this way. Thereupon, the resist pattern 25 is removed. After removing the resist pattern, the substrate is annealed for 10 seconds at a temperature of approximately 1000° C., for example, by rapid thermal annealing (RTA), thereby activating the implanted impurity ions.

After activation, on the high-voltage circuit region on the right-hand side of the figure, source/drain regions 17, 18 approximately 200 nm deep are formed on either side of the gate electrode, source/drain regions 15a approximately 200–300 nm deep are formed in the n-type well 111, and source/drain regions 16a approximately 300–400 nm deep are formed in the p-type well 112.

Figure 4K:
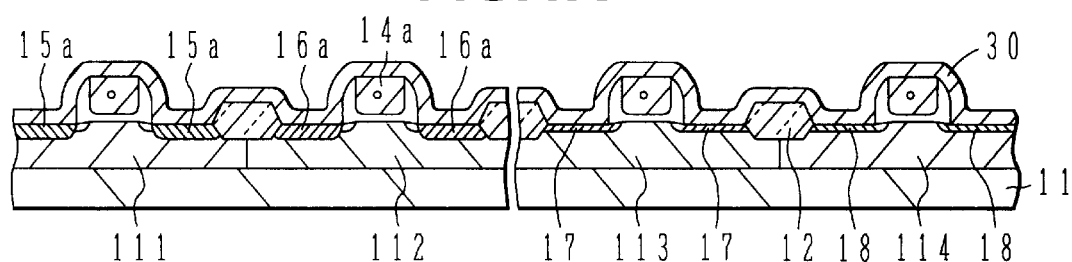

As shown in FIG. 4K, a Ti film 30 approximately 50 nm thick is then deposited on the surface of the substrate by sputtering, for example. Thereupon, the substrate is annealed for approximately 30 seconds at about 650° C., thereby causing the Ti film 30, which is a refractory metal with a high melting point, to react with the underlying Si to form a Ti silicide layer.

Figure 4L:
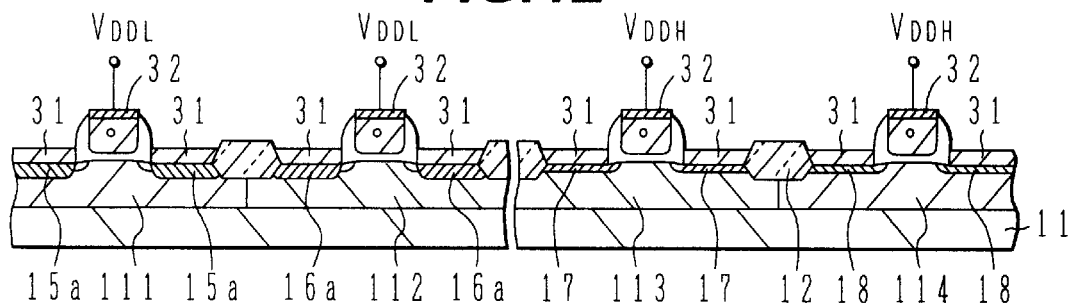

After this primary silicide reaction, the unreacted Ti film is removed by washing out. After removing the unreacted Ti film, the substrate is further annealed for approximately 0.1 seconds at around 950° C. to complete a secondary silicide reaction. In this way, silicide electrode layers 31 are formed on the source/drain regions of the MOS transistor and silicide electrode layers 32 are formed on the gate electrodes 14a, as shown in FIG. 4L.

In the low-voltage circuit shown on the left-hand side of the figures, MOS transistors are formed having a gate oxide film which is thicker at its edges than at its centre. The gate electrode and source/drain regions are doped with an impurity at high concentration.

In the high-voltage circuit shown on the right-hand side of the figures, the gate oxide film is formed to be thicker at its edges than at its centre, and the gate electrode is doped with a low concentration of impurity. Therefore, when an reverse-bias voltage is applied to the gate electrode, a depletion layer is created in the lower portion of the gate electrode. The MOS transistor for use in a high-voltage circuit only comprises source/drain regions which are doped shallowly with a low concentration of impurity, but since silicide electrodes are formed on the surface thereof, this does not present any operational problems.

In the present embodiment, the gate oxide film is made thicker at the edge regions of the gate electrode than at the centre thereof, and the impurity concentration in the gate electrode of the high-voltage circuit MOS transistor is reduced. Therefore, a depletion layer is created when a reverse bias is applied to the gate electrode of the high-voltage circuit MOS transistor. In cooperation with varying the thickness of the gate insulating film, the breakdown voltage of the insulated gate structure is improved.

The present invention has been described with reference to the preferred embodiments, but the present invention is not limited thereto. For example, the possibility of various modifications, improvements, combinations, and the like, will be self-evident to those skilled in the art.

What are claimed are:

1. A semiconductor device comprising a first MOS transistor driven at a first voltage and a second MOS transistor driven at a second voltage higher than the first voltage both formed on a same semiconductor substrate, wherein:

the second MOS transistor driven at said relatively high voltage comprises:
a first active region of a first conductivity type in said semiconductor substrate;
a first gate oxide film formed on said first active region; and
a first electrode formed on said first gate oxide film and doped at a first concentration with an impurity of a second conductivity type which is opposite to the first conductivity type; and the first MOS transistor driven at said relatively low voltage comprises:
a second active region of a first conductivity type in said semiconductor substrate;
a second gate oxide film formed on said second active region; and
a second electrode formed on said second gate oxide film and doped at a second concentration higher than the first concentration with an impurity of the second conductivity type.

2. The semiconductor device according to claim 1, wherein said first gate oxide film has increased thickness at edge regions thereof than in a central region thereof with respect to the direction of current flow in the transistor.

3. The semiconductor device according to claim 1, wherein said first and second electrodes are made from silicon.

4. The semiconductor device according to claim 1, wherein said second gate oxide film has increased thickness at edge regions thereof than in a central region thereof with respect to the direction of current flow in the transistor.

5. The semiconductor device according to claim 1, wherein the central regions of said first gate oxide film and said second gate oxide film are of equal thickness.

6. The semiconductor device according to claim 1, wherein said first electrode and second electrode have a sectional shape which is rounded at the edge regions thereof, with respect to the direction of current flow in the transistor.

7. The semiconductor device according to claim 1, wherein the first MOS transistor driven at said relatively low voltage comprises: a low-concentration current terminal region doped at low concentration with an impurity of the second conductivity type, which is formed in said second active region and overlaps partially on the substrate surface with one end portion of said second electrode; and a high-concentration current terminal region formed in said second active region adjacently to said low-concentration current terminal region on the opposite side of said second electrode; and the second MOS transistor driven at said second voltage comprises: a field insulating region surrounding said first active region; and a current terminal region doped at low concentration with an impurity of a second conductivity type, which is formed between said field insulating film and said first electrode and overlaps on the substrate surface with an end portion of the first electrode.

8. The semiconductor device according to claim 1, further comprising: third and fourth active regions of a second conductivity type formed in said semiconductor substrate; and third and fourth MOS transistors formed in said third and fourth active regions comprising third and fourth electrodes doped with impurity of said first conductivity type.

9. The semiconductor device according to claim 8, wherein said third MOS transistor is driven at said first voltage and said fourth MOS transistor is driven at said second voltage.

10. The semiconductor device according to claim 9, wherein said third MOS transistor has the same form as said first MOS transistor and is fabricated using reversed conductivity types thereto; and said fourth MOS transistor has the same form as said second MOS transistor and is fabricated using reversed conductivity types thereto.

11. The semiconductor device according to claim 10, wherein said first and third MOS transistors are located in the low-voltage circuit region of said semiconductor substrate and said second and fourth MOS transistors are located in the high-voltage circuit region of said semiconductor substrate.

12. The semiconductor device according to claim 11, wherein said low-voltage circuit region and said high-voltage circuit region are located on either side of a voltage converting circuit region.

13. The semiconductor device according to claim 12, wherein said high-voltage circuit region surrounds said low-voltage circuit region.

14. The semiconductor device according to claim 1, wherein said first and second gate oxide films have same thickness.

15. A semiconductor device comprising a first MOS transistor driven at a first voltage and a second MOS transistor driven at a second voltage higher than the first voltage both formed on a same semiconductor substrate, wherein:

the second MOS transistor driven at said relatively high voltage comprises:
a first active region of a first conductivity type in said semiconductor substrate;
a first gate oxide film formed on said first active region; and
a first electrode formed on said first gate oxide film and doped at a first concentration with an impurity of a second conductivity type which is opposite to the first conductivity type; and the first MOS transistor driven at said relatively low voltage comprises:
a second active region of a first conductivity type in said semiconductor substrate;
a second gate oxide film formed on said second active region;

a second electrode formed on said second gate oxide film and doped at a second concentration higher than the first concentration with an impurity of the second conductivity type, and source/drain regions comprising low concentration regions and high concentration regions, said low concentration regions being doped at a low concentration level with an impurity of the second conductivity type, and being formed in said second active region such as to overlap partially on the substrate surface with respective end portions of said second electrode; and said high concentration regions doped at a higher level than said low concentration level formed in said second active region adjacent to said low-concentration regions on opposite sides of said second electrode; and the second MOS transistor driven at said second voltage further comprises: a field insulating region surrounding said first active region; and source/drain regions doped at the same low concentration level as said low concentration regions of said source/regions of said first MOS transistor with an impurity of the second conductivity type, which is formed between said field insulating film and said first electrode and overlaps on the substrate surface with respective end portions of the first electrode.

* * * * *